United States Patent
Miura et al.

(10) Patent No.: US 7,688,161 B2
(45) Date of Patent: Mar. 30, 2010

(54) ACOUSTIC WAVE DEVICE AND FILTER USING THE SAME

(75) Inventors: Michio Miura, Kawasaki (JP); Satoru Matsuda, Kawasaki (JP); Shogo Inoue, Kawasaki (JP); Takashi Matsuda, Kawasaki (JP); Masanori Ueda, Kawasaki (JP); Seiichi Mitobe, Yokohama (JP)

(73) Assignees: Fujitsu Media Devices Limited, Yokohama (JP); Fujitsu Limited, Kawasaki (JP)

(*) Notice: Subject to any disclaimer, the term of this patent is extended or adjusted under 35 U.S.C. 154(b) by 90 days.

(21) Appl. No.: 11/976,441

(22) Filed: Oct. 24, 2007

(65) Prior Publication Data
US 2008/0129418 A1    Jun. 5, 2008

(30) Foreign Application Priority Data
Oct. 25, 2006    (JP)    ............... 2006-290494

(51) Int. Cl.
H03H 9/64    (2006.01)
H03H 9/52    (2006.01)
H03H 9/25    (2006.01)

(52) U.S. Cl. .............. 333/193; 333/195; 310/313 B; 310/313 D

(58) Field of Classification Search ......... 333/193–196; 310/313 B, 313 D
See application file for complete search history.

(56) References Cited

U.S. PATENT DOCUMENTS

| | | | | |
|---|---|---|---|---|
| 5,694,095 A | * | 12/1997 | Mineyoshi | ................ 333/193 |
| 5,757,250 A | * | 5/1998 | Ichikawa et al. | ............. 333/193 |
| 6,593,678 B1 | * | 7/2003 | Flowers | .................. 310/313 R |
| 2005/0231306 A1 | * | 10/2005 | Kushitani et al. | ............ 333/195 |

FOREIGN PATENT DOCUMENTS

| | | | | |
|---|---|---|---|---|
| FR | 2 827 720 | * | 1/2003 | |
| JP | 02-177712 | * | 7/1990 | ................ 333/193 |
| JP | 03-222511 | * | 10/1991 | ................ 333/193 |
| JP | 5-167384 A | | 7/1993 | |
| JP | 06-232678 | * | 8/1994 | ................ 29/25.35 |
| JP | 07-273597 | * | 10/1995 | |
| JP | 7-297675 | | 11/1995 | |
| JP | 08-065089 | * | 3/1996 | |
| JP | 11-274884 | * | 10/1999 | |
| JP | 11-330904 | * | 11/1999 | |
| JP | 2005-142629 | * | 6/2005 | |

OTHER PUBLICATIONS

Machine translation of JP 07-273597 dated Oct. 1995.*
Machine translation of JP 2005-142629 dated Jun. 2005.*
Machine translation of JP 11-330904 dated Nov. 1999.*
Masatsune Yamaguchi et al., "Highly Piezolelectric Boundary Waves in $Si/SiO_2/LiNbO_3$ Structure", Proceeding of 1998 IEEE International Frequency Control Symposium, the United States of America, IEEE, 1998, pp. 484-488.

* cited by examiner

*Primary Examiner*—Barbara Summons
(74) *Attorney, Agent, or Firm*—Arent Fox LLP

(57) ABSTRACT

An acoustic wave device includes a piezoelectric substrate, a resonator having comb electrodes that are provided above the piezoelectric substrate and excite an acoustic wave, and a capacitor that is provided above the piezoelectric substrate and is connected in series or parallel with the resonator, the capacitor including electrodes that horizontally face each other above the piezoelectric substrate. The electrodes of the capacitor are further from the piezoelectric substrate than the comb electrodes of the resonator.

11 Claims, 14 Drawing Sheets

PRIOR ART

ACOUSTIC WAVE DEVICE AND FILTER USING THE SAME

BACKGROUND OF THE INVENTION

1. Field of the Invention

The present invention relates to acoustic wave devices and filters, and more particularly, to an acoustic wave device having a capacitance formed by electrodes that horizontally face each other on a piezoelectric substrate and a filter using the same.

2. Description of the Related Art

A surface acoustic wave (SAW) device is well known as one of acoustic wave devices that utilize acoustic waves. The SAW device has comb electrodes formed by an interdigital transducer (IDT) formed on a surface of a piezoelectric substrate. Electric power is applied to the comb electrodes, and an acoustic wave is excited. The SAW device can be miniaturized and lightened in weight. Further, the SAW device is capable of realizing high attenuation. Because of these advantages, the SAW filter is widely applied to devices processing radio signals in a frequency range of, for example, 45 MHz to 2 GHz, such as transmission bandpass filters, reception bandpass filters and antenna duplexers.

There is another acoustic wave device called acoustic boundary wave device in which an acoustic wave is propagated along a boundary between two different media. This type of device has an advantage in that even if foreign particles adhere to surfaces of the two different media, these particles do not cause frequency variation an loss, so that downsizing can be easily realized. There is another advantage in that packaging does not need a hermetically sealed hollow space structure. It is to be noted that the SAW device is required to be mounted in the hermetically sealed hollow space structure in order to prevent foreign particles from adhering to the surface of the device. Furthermore, the temperature coefficient of frequency can be improved by covering the comb electrodes with an $SiO_2$ film.

The recent sophisticated performance of cellular phones needs acoustic wave devices having improved performance such as lower loss in the pass band and greater attenuation in stop bands, and downsizing. For example, in the PCS (Personal Communication Service) system that is one of mobile phone service systems in the North America, the pass band and the stop band are very close to each other. It is well known that a material having a small electromechanical coupling coefficient ($k^2$) is advantageously used to realize the filter having the pass band and the stop band close to each other. However, $k^2$ is the physical factor inherent in material itself and has a specific value that depends on the selected material. For example, $k^2$ of 42° Y-cut X-propagation lithium tantalate ($LiTaO_3$) widely used for bandpass filters in cellular phones is approximately equal to 7%.

It is very difficult to control the value of $k^2$ itself. Thus, there have been proposals for effectively reducing $k^2$. FIG. 1A is a plan view of a conventional SAW device, and FIG. 1B is an equivalent circuit diagram of the SAW device shown in FIG. 1A. Referring to FIG. 1A, there is illustrated a resonator 13 in which a pair of reflection electrodes R1 and a pair of comb electrodes 12 interposed between the reflection electrodes R1 are formed on a piezoelectric substrate 16. A capacitor 14 composed f a pair of comb electrodes is formed on the piezoelectric substrate 16. The capacitor 14 is connected in parallel with the pair of comb electrodes 12, and has a different period from that of the comb electrodes 12. The pair of comb electrodes 12 of the comb-electrode type capacitor 14 is composed of comb electrodes 14a an 14b, which horizontally face each other on the piezoelectric substrate 16. A desired resonance frequency can be obtained by connecting the comb-electrode type capacitor 14 to the resonator 13. Thus, the value of $k^2$ can be effectively controlled. It is to be noted that only a few electrode fingers of the comb electrodes 12, the reflection electrodes R1 and the capacitor 14 are illustrated for the sake of simplicity. However, actually, a large number of electrode fingers is provided.

In the SAW device shown in FIGS. 1A and 1B, the comb-electrode type capacitor 14 has a large value of the resonance sharpness (quality factor Q) in a frequency range lower than the resonance frequency of the capacitor 14. However, only a small value of the resonance sharpness Q is available in a frequency range higher than the resonance frequency. As the resonance sharpness Q has a larger value, the device has a smaller insertion loss. It is therefore desired that the Q value of the comb-electrode type capacitor 14 is as large as possible.

SUMMARY OF THE INVENTION

The present invention has been made in view of the above circumstance, and provides an acoustic wave device having a larger Q value formed by electrodes horizontally facing each other on a piezoelectric substrate.

According to an aspect of the present invention, there is provided an acoustic wave device including: a piezoelectric substrate; a resonator having comb electrodes that are provided above the piezoelectric substrate and excite an acoustic wave; and a capacitor that is provided above the piezoelectric substrate and is connected in series or parallel with the resonator, the capacitor including electrodes that horizontally face each other above the piezoelectric substrate. The electrodes of the capacitor are further from the piezoelectric substrate than the comb electrodes of the resonator.

According to another aspect of the present invention, there is provided a filter having resonators including the above-mentioned acoustic wave device.

DESCRIPTION OF THE PREFERRED EMBODIMENTS

Figure 1A:
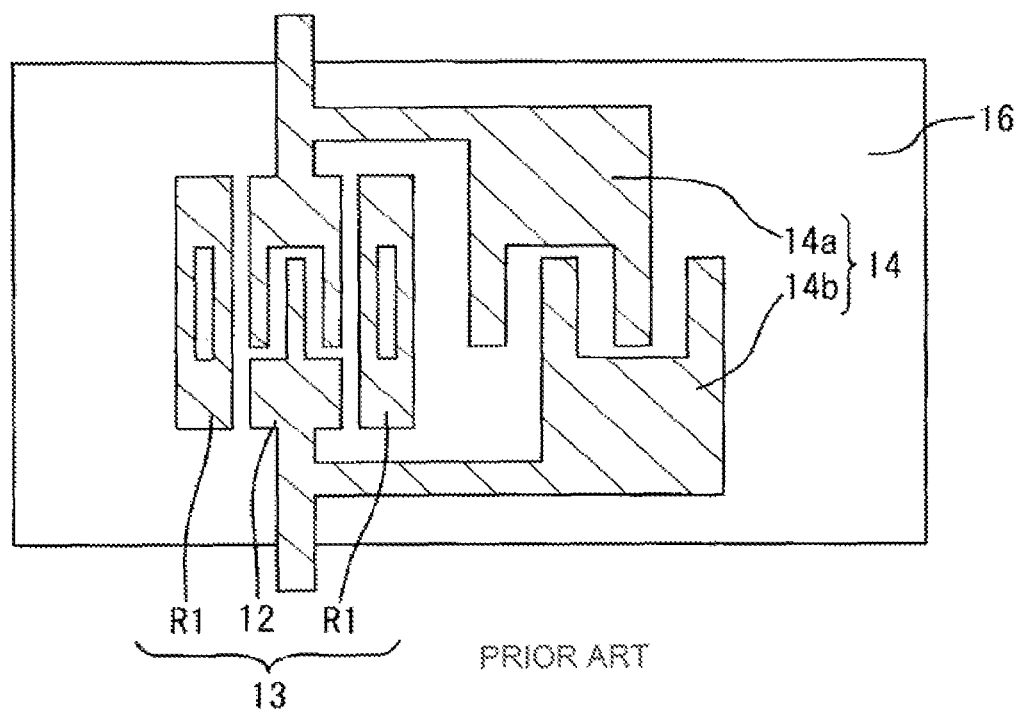
FIG. 1A is a plan view of a conventional SAW device.
Figure 1B:
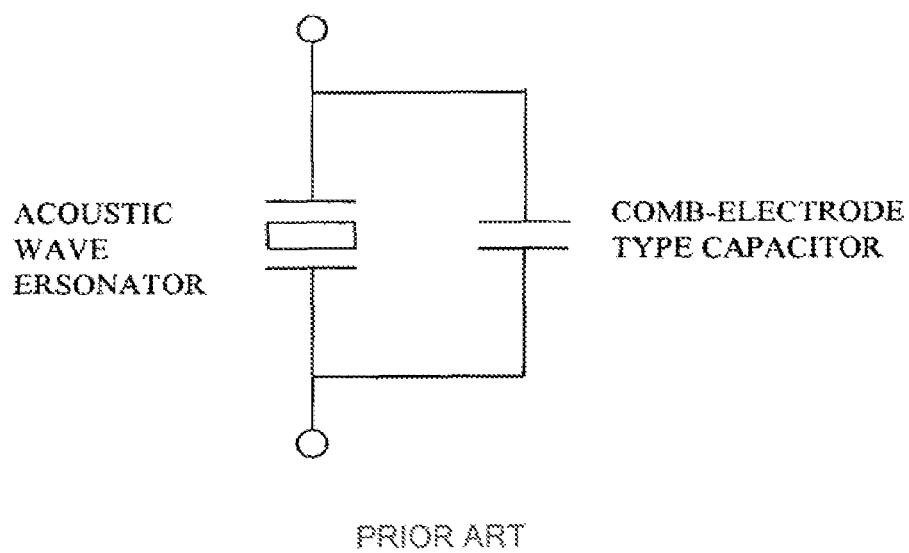
FIG. 1B is an equivalent circuit diagram of the SAW device shown in FIG. 1A.
Figure 2:
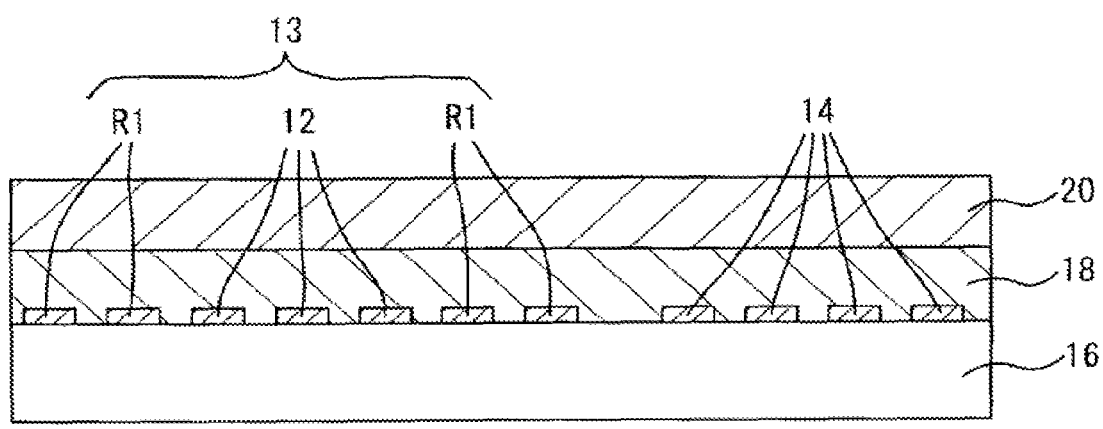
FIG. 2 is a cross-sectional view of an acoustic wave device in accordance with a first comparative example.

First, a description will be given of an experiment directed to more specifically identifying the disadvantages of the device shown in FIGS. 1A and 1B. FIG. 2 is a cross-sectional view of an acoustic wave device used as a first comparative example in the experiment. Referring to FIG. 2, the device has a piezoelectric substrate 16 made of 30° Y-cut X-propagation lithium niobate ($LiNbO_3$) on which the resonator 13 is formed. The resonator 13 is composed of the pair of comb electrodes 12 and the reflection electrodes R1, which electrodes may be made of copper. The comb electrodes 12 excite an acoustic wave. The comb-electrode type capacitor 14 made of copper and connected in parallel with the resonator 13 is formed on the piezoelectric substrate 16. The pair of comb electrodes of the capacitor 14 face each other in a horizontal direction on the piezoelectric substrate 16. The horizontal direction is defined as a direction in which the acoustic wave excited by the resonator 13 is propagated. For example, the comb electrodes 12 have a thickness of 180 nm, an electrode period of 2.0 μm and an electrode finger width of 0.5 μm. For example, the comb-electrode type capacitor 14 has a thickness of 180 nm, an electrode period of 3.0 μm, an electrode finger width of 1.0 μm, and a finger-to-finger distance of 0.5 μm. A first dielectric film 18, which may be 1.0 μm thick and made of silicon oxide ($SiO_2$) is provided so as to cover the resonator 13 and the capacitor 14. A second dielectric film 20, which may be 2.0 μm thick and made of aluminum oxide ($Al_2O_3$), is provided on the first dielectric film 18.

Figure 3:
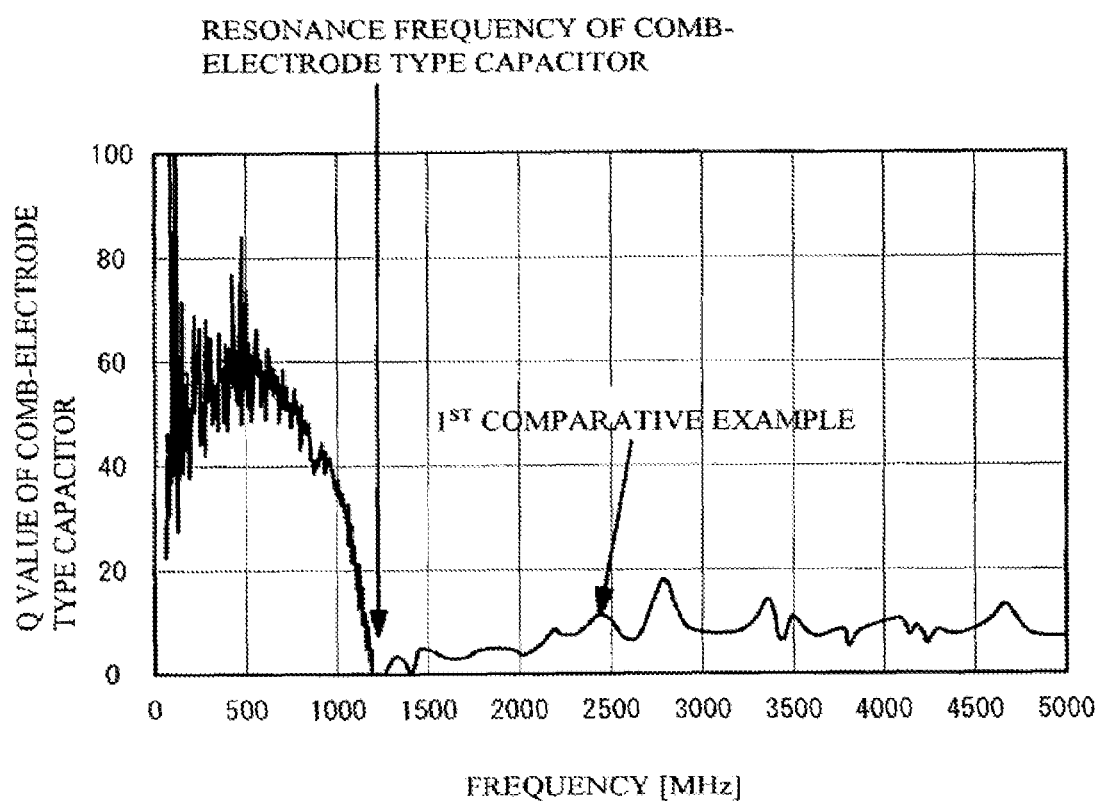
FIG. 3 is a graph of a Q value of comb-electrode type capacitor employed in the first comparative example as a function of frequency.

FIG. 3 is a graph of the resonance sharpness Q of the capacitor 14 as a function of frequency of the acoustic wave device according to the first comparative example. Referring to FIG. 3, the resonance frequency of the capacitor 14 is about 1200 MHz, and the Q value thereof at frequencies lower than 1200 MHz, for example, at about 500 MHz is large as approximately 50. In contrast, the Q value of the capacitor 14 at frequencies higher than 1200 MHz, for example, at 2000 MHz is as extremely small as approximately 4.

In the first comparative example, it is necessary to reduce the period of the electrodes of the capacitor 14 to make the resonance frequency higher than 2000 MHz in order to increase the Q value of the capacitor 14 at about 2000 MHz. For example, when the period of the electrodes of the capacitor 14 is set equal to 1.0 μm, the resonance frequency of the capacitor 14 is 3600 MHz. However, in order to realize a period of 1.0 μm of the capacitor 14, the width of the electrode fingers must be as very thin as 0.33 μm, and the finger-to-finger distance must be as very thin as 0.17 μm. In this case, the electrode fingers have increased electric resistances, and the Q value of the capacitor 14 is thus degraded. Further, it is very difficult to reliably produce the very fine patterns of the electrodes. Consequently, it is very difficult to realize a large Q value of the capacitor 14 at high frequencies. The following embodiments of the present invention are capable of overcoming the above problems.

First Embodiment

Figure 4A:
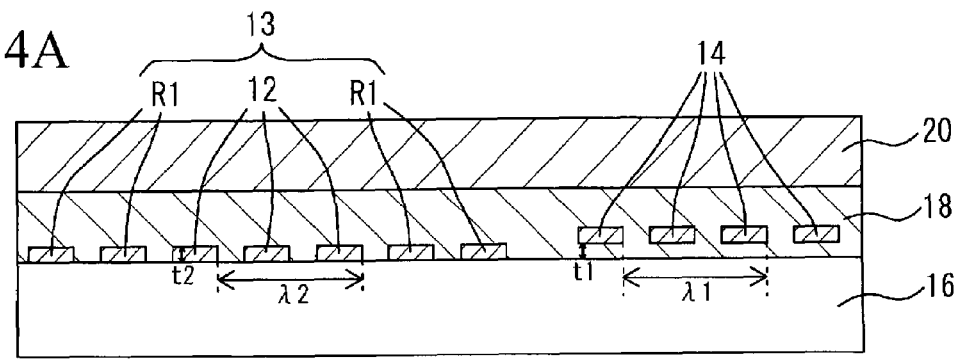
FIG. 4A is a cross-sectional view of an acoustic wave device in accordance with a first embodiment.
Figure 4B:
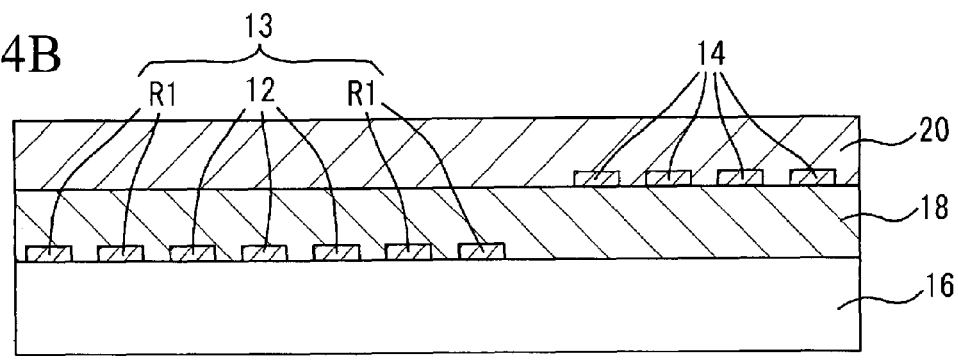
FIG. 4B is a cross-sectional view of an acoustic wave device in accordance with a first variation of the first embodiment.
Figure 4C:
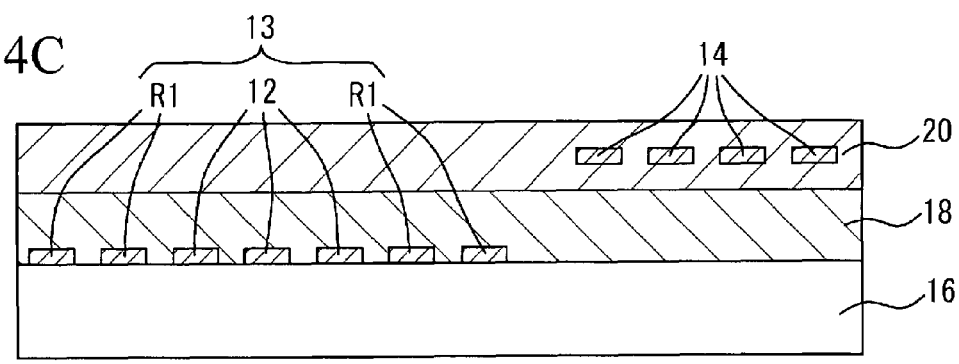
FIG. 4C is a cross-sectional view of an acoustic wave device in accordance with a second variation of the first embodiment.

FIG. 4A is a cross-sectional view of an acoustic wave device in accordance with a first embodiment, and FIG. 4B is a cross-sectional view of a first variation of the first embodiment. FIG. 4C is a cross-sectional view of a second variation of the first embodiment, and FIG. 3 is a cross-sectional view of a third variation of the first embodiment. Referring to FIG. 4A, the capacitor 14 is provided on the piezoelectric substrate 16 away from the piezoelectric substrate 16 by a distance almost equal to the thickness of the comb electrodes 12 of the resonator 13. That is, the distance $t_1$ between the capacitor 14 and the piezoelectric substrate 16 is almost equal to the thickness $t_2$ of the comb electrodes 12. The comb-electrode type capacitor 14 has a thickness of 180 nm, a period of electrodes of 4.0 μm, and an electrode finger width of 1.0 μm. The other structures of the first embodiment are similar to those of the first comparative example shown in FIG. 2. In FIG. 4A, λ1 denotes the period of the electrodes of the capacitor 14, and λ2 denotes the period of the electrodes of the comb electrodes 12.

Figure 4D:
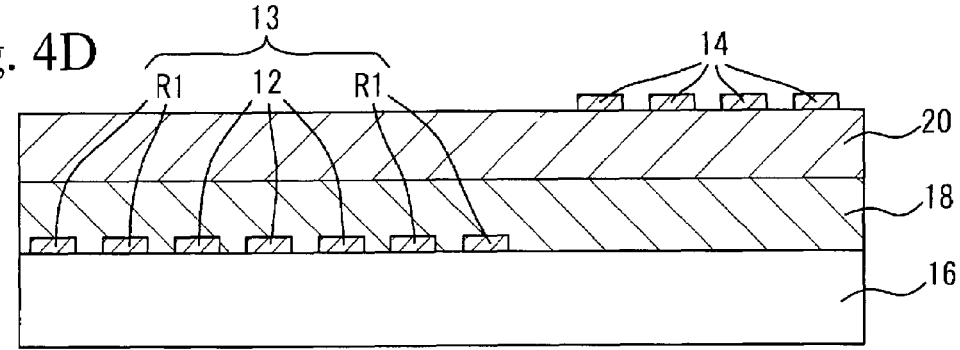
FIG. 4D is a cross-sectional view of an acoustic wave device in accordance with a third variation of the first embodiment.

FIG. 4B shows an arrangement of the first variation in which the capacitor 14 is provided on the first dielectric film 18. FIG. 4C shows an arrangement of the second variation in which the capacitor 14 is provided within or embedded in the second dielectric film 20. FIG. 4D shows an arrangement of the third variation in which the capacitor 14 is provided on the second dielectric film 20. The other structures of the above arrangements are the same as those of the first embodiment.

Figure 5:
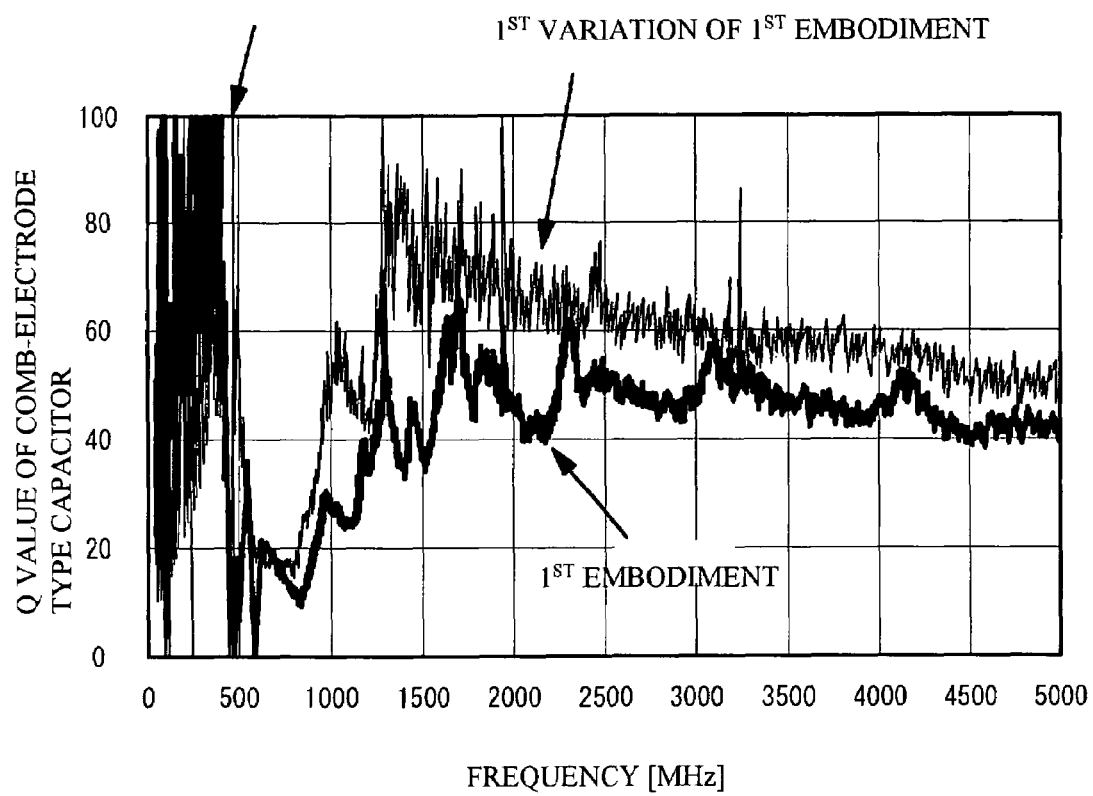
FIG. 5 is a graph of the Q values of comb-electrode type capacitors employed in the first embodiment and its first variation as a function of frequency.

FIG. 5 is a graph of the Q value of the comb-electrode type capacitors of the first embodiment and the first variation as a function of frequency. Referring to FIG. 5, the resonance frequencies of the capacitors 14 employed in the first embodiment (thick solid line) and the first comparative example (thin solid line) are approximately 500 MHz. The Q value of the capacitor 14 at frequencies even higher than the resonance frequency is still large. For example, the Q value of the capacitor 14 at 2000 MHz is as large as 45 in the first embodiment, and is as large as 60 in the first variation. This is because as the electrodes are further from the piezoelectric substrate 16, the electrodes are less affected by the piezoelectric substrate, and the resonance performance of the electrodes is degraded. Thus, when the capacitor 14 is further from the piezoelectric substrate 16 than the comb electrodes 12 of the resonator 13, the capacitor 14 is less affected by the piezoelectric substrate 16 and the resonance performance of the capacitor 14 is weakened. Thus, the capacitor 14 has a large Q value even at high frequencies.

FIG. 5 shows the first embodiment and the first variation thereof. The second and third variations provide a larger Q value of the capacitor 14 at frequencies higher than the resonance frequency because the capacitor 14 is further from the piezoelectric substrate 16.

Figure 6A:
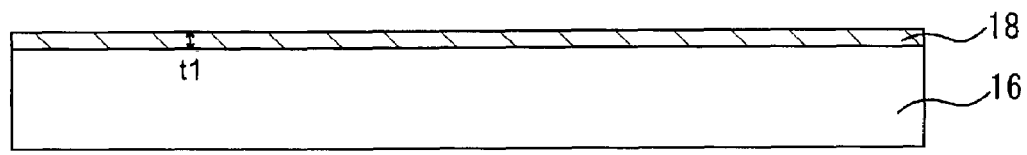
FIGS. 6A through 6C show a method for manufacturing the acoustic wave device in accordance with the first embodiment.
Figure 6B:
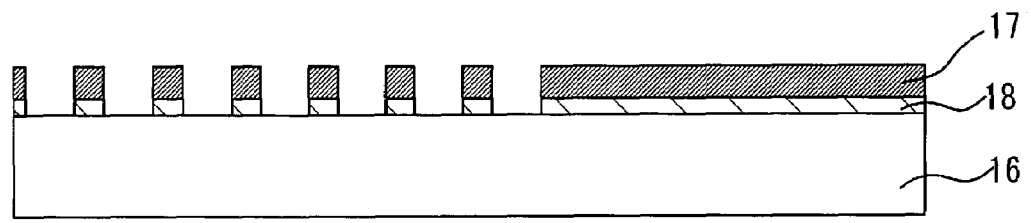
Figure 6C:
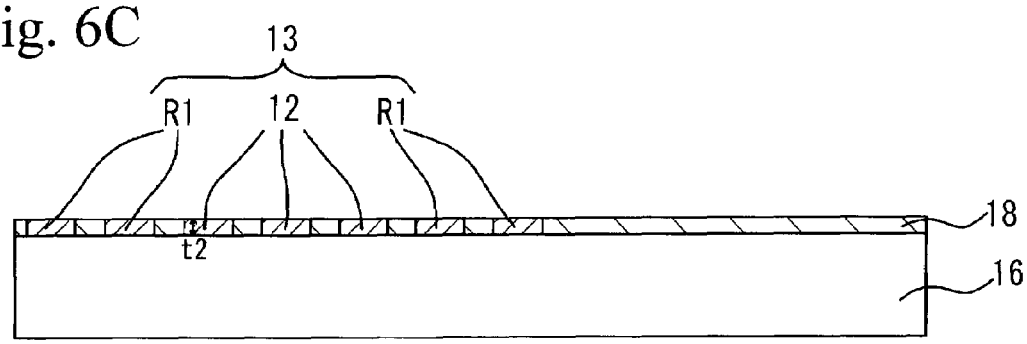

According to the first embodiment, the first dielectric film 18 having the thickness $t_1$ is interposed between the capacitor 14 and the piezoelectric substrate 16, and the thickness $t_1$ is almost equal to the thickness $t_2$ of the comb electrodes 12 that form the resonator 13. Now, a description will be given, with reference to FIGS. 6A through 6C, of a method for manufacturing the comb electrodes 12 and the reflection electrodes R1 that form the resonator 13. Referring to FIG. 6A, the first dielectric film 18 having almost the same thickness $t_1$ as the thickness $t_2$ of the comb electrodes 12 of the resonator 13 is formed on the piezoelectric substrate 16. Referring to FIG. 6B, the first dielectric film 18 is etched with a patterned resist 17. Then, as shown in FIG. 6C, the comb electrodes 12 and the reflection electrodes R1 having the thickness $t_1$ are formed by liftoff, so that the resonator 13 can be completed. The first dielectric film 18 having almost the same thickness as the comb electrodes 12 of the resonator 13 can be simultaneously formed in the process of forming the comb electrodes 12 and the reflection electrodes R1. Thus, when the thickness $t_1$ of the first dielectric film 18 formed between the capacitor 14 and the piezoelectric substrate 16 is almost equal to the thickness $t_2$ of the comb electrodes 12 of the resonator 13, the first dielectric film 18 can be easily formed, as compared to a case where $t_1$ is different from $t_2$.

In the first comparative example, in order to increase the Q value of the capacitor 14 at high frequencies (higher than the resonance frequency), the period $\lambda_1$ of the electrodes of the capacitor 14 must be reduced. In contrast, according to the first embodiment, the Q value of the capacitor 14 can be increased by setting the capacitor 14 further from the piezoelectric substrate 16 than the comb electrodes 12 of the resonator 13. Thus, even when the period $\lambda_1$ of the comb electrodes of the capacitor 14 is greater than the period $\lambda_2$ of the comb electrodes of the resonator 13, an almost equal or greater Q value of the capacitor 14 can be obtained by adjusting the distance $t_1$ between the capacitor 14 and the piezoelectric substrate 16. When the period $\lambda_1$ is increased, the electrode fingers can be made wide or thick, and the electric resistance thereof can be reduced. Thus, the Q value of the capacitor 14 can be improved.

According to the first embodiment, the first dielectric film 18 that covers the comb electrodes 12 and the reflection electrodes R1 of the resonator 13 is formed by the SiO$_2$ film that is thicker than the comb electrodes 12. It is thus possible to improve the temperature characteristic of frequency. Further, the second dielectric film 20 made of Al$_2$O$_3$ having a greater acoustic velocity than SiO$_2$ of the first dielectric film 18 is formed on the first dielectric film 18. Thus, the acoustic boundary wave device can be obtained in which the energy of acoustic wave is confined between the substrate 16 and the first dielectric film 18.

Furthermore, according to the first embodiment, the comb-electrode type capacitor 14 is covered with the first dielectric film 18 or the second dielectric film 20. It is thus possible to prevent foreign particles from adhering to the surface of the comb-electrode type capacitor 14.

The above-mentioned first embodiment uses the first dielectric film 18 made of SiO$_2$. The first dielectric film 18 may be another dielectric film. However, in terms of improving the temperature coefficient of frequency, the first dielectric film 18 is preferably made of SiO$_2$. In the first embodiment, the dielectric film 18 covers the comb electrodes 12, the reflection electrodes R1 and the comb-electrode type capacitor 14. However, the temperature coefficient of frequency may be improved when the dielectric film 18 covers at least the comb electrodes 12 and the reflection electrodes R1.

In the above-mentioned first embodiment, the second dielectric film 20 is made of Al$_2$O$_3$. However, the second dielectric film 20 may be made of another dielectric material. Preferably, the second dielectric film 20 is made of a material having a higher acoustic velocity than that of the material of the first dielectric film 18 in terms of confining the energy of acoustic wave between the piezoelectric substrate 16 and the first dielectric film 18. In the foregoing, the second dielectric film 20 is provided on the entire surface of the first dielectric film 18 that covers the comb electrodes 12, the reflection electrodes R1 and the comb-electrode type capacitor 14. The second dielectric film 20 may be provided on the first dielectric film 18 that covers only the comb electrodes 12 and the reflection electrodes R1 of the resonator 13.

In the above-mentioned first embodiment, the capacitor 14 is exemplarily described as a capacitor having opposing electrodes in the horizontal direction. Another arrangement may be made because the resonance performance of the electrodes can be weakened by locating the electrodes away from the piezoelectric substrate, and an increased Q value can be obtained at high frequencies. Therefore, another type of capacitor like double spiral may be used as long as it is comprised of electrodes opposite to each other in the horizontal direction on the piezoelectric substrate. Particularly, the comb-electrode type capacitor may be preferably used because the resonance performance of the electrodes can be weakened by placing the electrodes apart from the piezoelectric substrate.

In the first embodiment, the capacitor 14 is connected in parallel with the resonator 13. Alternatively, the capacitor 14 may be connected in series with the resonator 13.

The piezoelectric substrate 16 is not limited to LiNbO$_3$ but may be made of another piezoelectric substance. Particularly, a piezoelectric material having a large electromechanical coupling coefficient k$^2$ is preferably used because the resonance performance of the capacitor 14 can be weakened by spacing the capacitor 14 apart from the piezoelectric substrate 16.

In the first embodiment, the thickness $t_1$ of the first dielectric film 18 formed between the capacitor 14 and the piezoelectric substrate 16 is almost equal to the thickness $t_2$ of the comb electrodes 12 of the resonator 13. However, the present invention is not limited to the above relationship. The thickness $t_1$ is different from the thickness $t_2$ as long as the capacitor 14 is further from the piezoelectric substrate 16 than the comb electrodes 12. Preferably, the thickness $t_1$ is almost equal to the thickness $t_2$ in order to facilitate the manufacturing process.

According to the first variation of the first embodiment, the comb-electrode type capacitor 14 is provided on the first dielectric film 18. Thus, the capacitor 14 can be formed after the first dielectric film 18 that covers the comb electrodes 12 and the reflection electrodes R1 is completed. It is thus possible to easily set the capacitor 14 further from the piezoelectric substrate 16 than the comb electrodes 12, as compared to the arrangement in which the capacitor 14 is formed within the first dielectric film 18 or the second dielectric film 20.

Second Embodiment

Figure 7A:
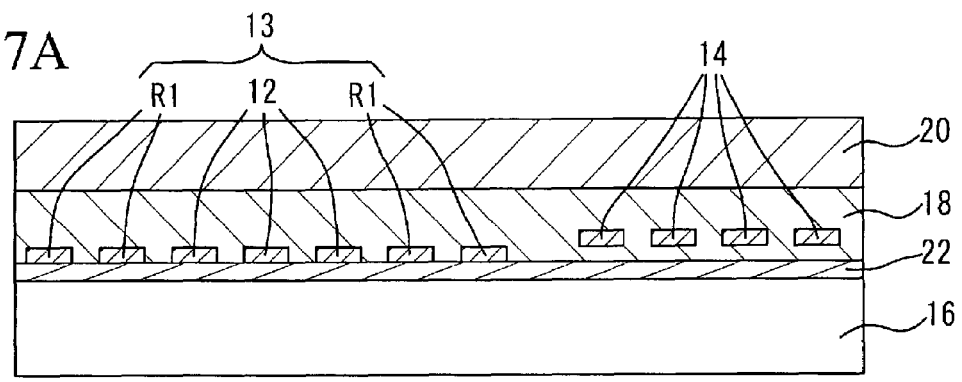
FIG. 7A is a cross-sectional view of an acoustic wave device in accordance with a second embodiment.
Figure 7B:
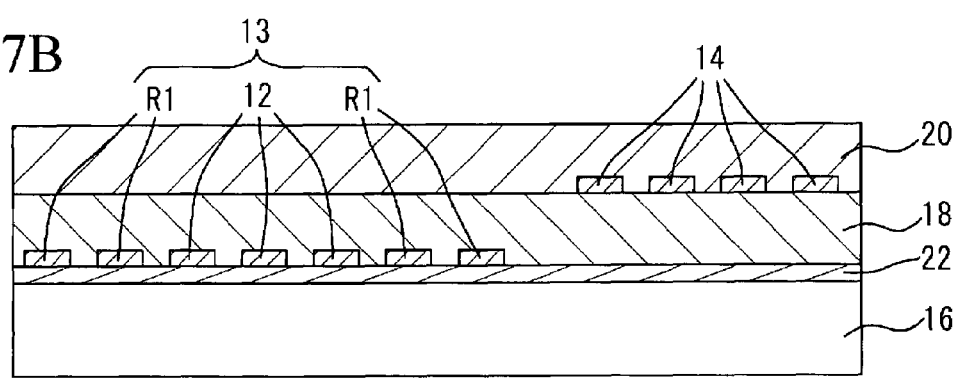
FIG. 7B is a cross-sectional view of an acoustic wave device in accordance with a first variation of the second embodiment.
Figure 7C:
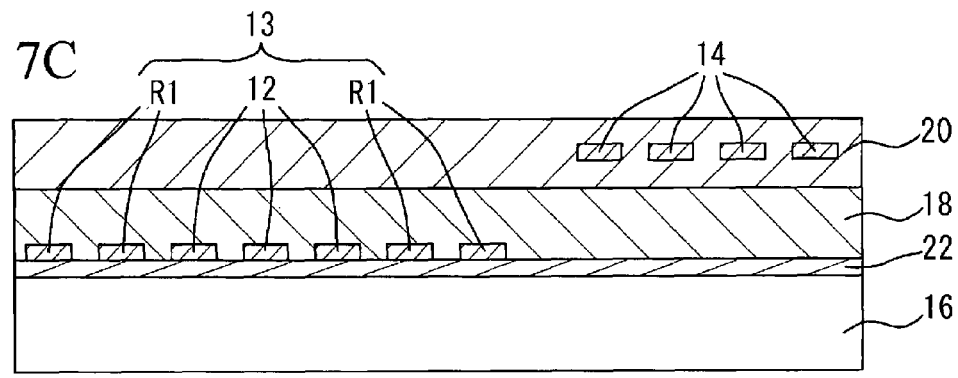
FIG. 7C is a cross-sectional view of an acoustic wave device in accordance with a second variation of the second embodiment.
Figure 7D:
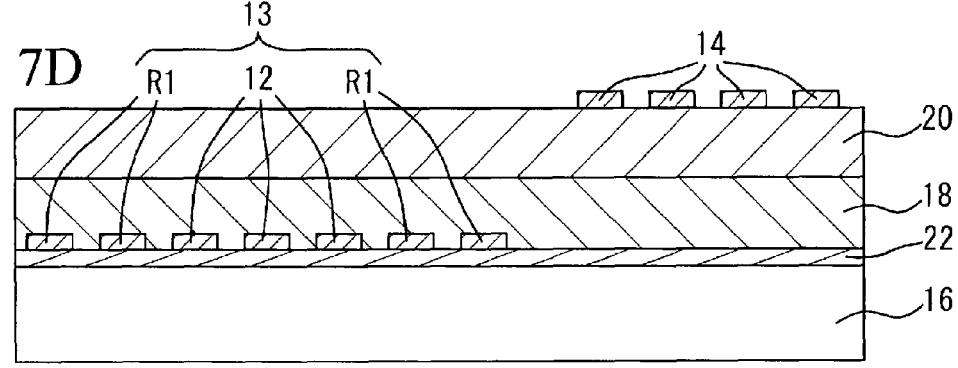
FIG. 7D is a cross-sectional view of an acoustic wave device in accordance with a third variation of the second embodiment.

FIG. 7A is a cross-sectional view of an acoustic wave in accordance with a second embodiment, and FIG. 7B is a cross-sectional view of a first variation of the second embodiment. FIG. 7C is a cross-sectional view of a second variation of the second embodiment, and FIG. 7D is a cross-sectional view of a third variation of the second embodiment. Referring to FIG. 7A, a third dielectric film 22 made of $Al_2O_3$ is provided on the piezoelectric substrate 16. The other structures of the second embodiment are the same as those of the first embodiment shown in FIG. 4A.

FIG. 7B shows an arrangement in which the capacitor 14 is formed on the first dielectric film 18. FIG. 7C shows an arrangement in which the capacitor 14 is formed within the second dielectric film 20. FIG. 7D shows an arrangement in which the capacitor 14 is formed on the second dielectric film 20. The other structures of the devices shown in FIGS. 7B through 7D are the same as those of the second embodiment shown in FIG. 7A.

According to the second embodiment, the third dielectric film 22 made of $Al_2O_3$ is provided between the piezoelectric substrate 16 and the resonator 13 composed of the comb electrodes 12 and the refection electrodes R1. It is thus possible to improve the temperature characteristic of frequency of the acoustic wave device, as compared to the first embodiment.

The third dielectric film 22 of the second embodiment is not limited to $Al_2O_3$ but may be made of another dielectric material. Particularly, in terms of improving the temperature coefficient of frequency, the third dielectric film 22 is preferably made of a dielectric material that has a lower temperature coefficient than that of the piezoelectric substrate 16 and a relative dielectric constant greater than that of the first dielectric film 18. An example of such a material is silicon nitride (SiN).

In the above-mentioned second embodiment, the third dielectric film 22 is provided between the capacitor 14 and the piezoelectric substrate 16. In terms of improvements in the temperature characteristic of frequency, the third dielectric film 22 may be provided between the piezoelectric substrate 16 and the resonator 13 composed of the comb electrodes 12 and the reflection electrodes R1.

Third Embodiment

Figure 8A:
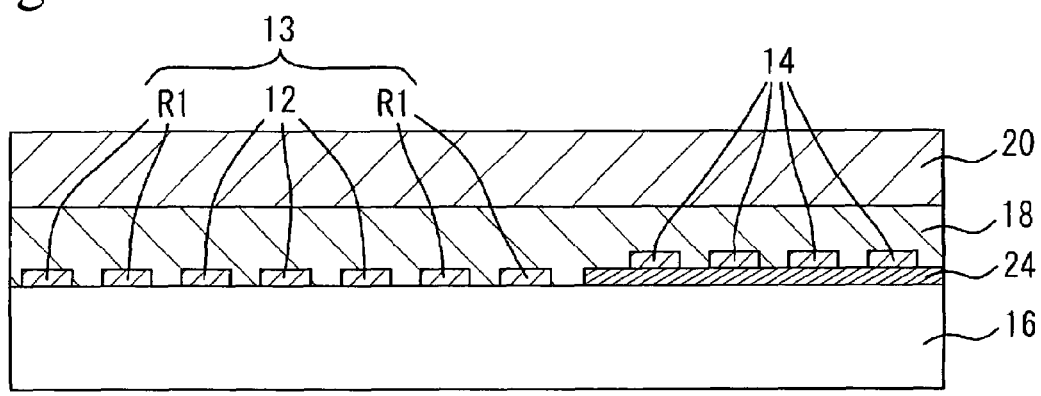
FIG. 8A is a cross-sectional view of an acoustic wave device in accordance with a third embodiment.
Figure 8B:
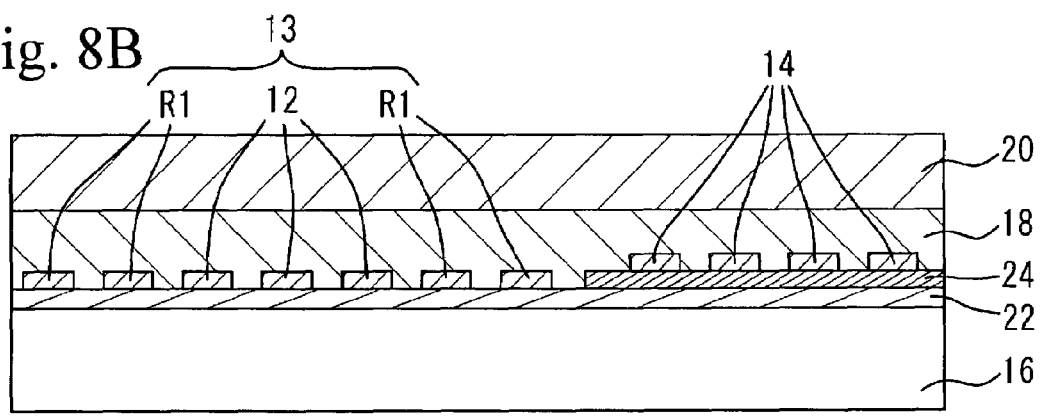
FIG. 8B is a cross-sectional view of an acoustic wave device in accordance with a first variation of the third embodiment.

FIG. 8A is a cross-sectional view of an acoustic wave device in accordance with a third embodiment, and FIG. 8B is a cross-sectional view of a first variation of the third embodiment. Referring to FIG. 8A, a fourth dielectric film 24 made of $Al_2O_3$ is provided between the capacitor 14 and the piezoelectric substrate 16. The other structures of the fourth embodiment are the same as those of the first embodiment shown in FIG. 4A.

FIG. 8B shows an exemplary arrangement in which the third dielectric film 22 is provided on the piezoelectric substrate 16. The other structures are the same as those of the third embodiment shown in FIG. 8A.

According to the third embodiment, the fourth dielectric film 24 is provided between the capacitor 14 and the piezoelectric substrate 16. Therefore, by changing the thickness of the fourth dielectric film 24, only the distance between the capacitor 14 and the piezoelectric substrate 16 can be changed without changing the distance between the comb electrodes 12 and the piezoelectric substrate 16. Thus, as compared to the first embodiment, it is possible to easily form the capacitor 14 further from the piezoelectric substrate 16 than the comb electrodes 12.

The fourth dielectric film 24 of the third embodiment is not limited to $Al_2O_3$ but may be another dielectric material such as SiN.

Fourth Embodiment

Figure 9A:
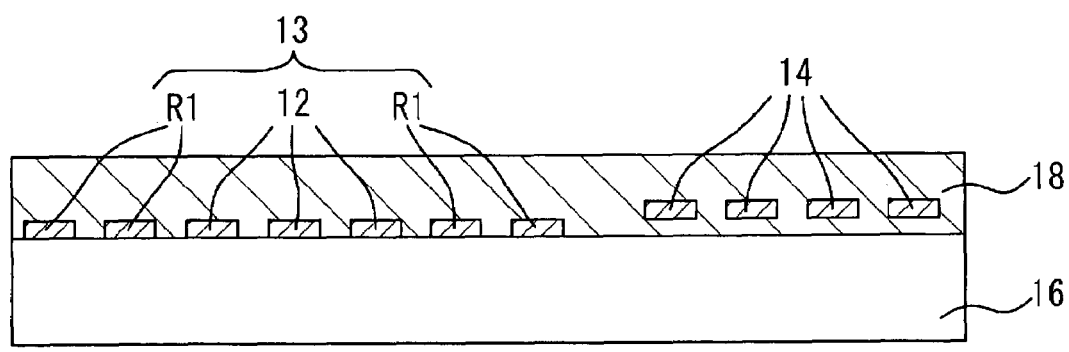
FIG. 9A is a cross-sectional view of an acoustic wave device in accordance with a fourth embodiment.
Figure 9B:
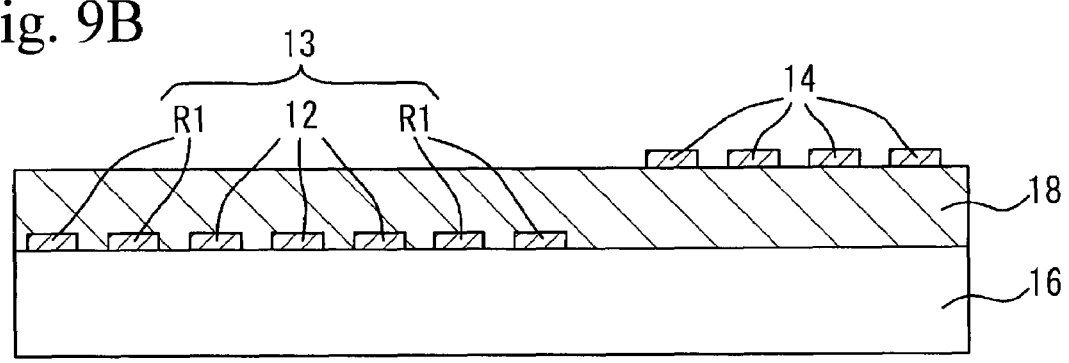
FIG. 9B is a cross-sectional view of an acoustic wave device in accordance with a first variation of the fourth embodiment.

FIG. 9A is a cross-sectional view of an acoustic wave device in accordance with a fourth embodiment, and FIG. 9B is a cross-sectional view of a first variation of the fourth embodiment. Referring to FIG. 9A, the fourth embodiment is the same as the first embodiment shown in FIG. 4A except that the second dielectric film 20 is not provided on the first dielectric film 18.

FIG. 9B shows an arrangement in which the capacitor 14 is provided on the dielectric film 18. The other structures are the same as those of the fourth embodiment shown in FIG. 9A.

In the acoustic wave device of the fourth embodiment, the first dielectric film 18 made of $SiO_2$ is thicker than the comb electrodes 12 of the resonator 13. Thus, the fourth embodiment is a Love wave or boundary acoustic wave device having improved temperature characteristic of frequency.

Fifth Embodiment

Figure 10A:
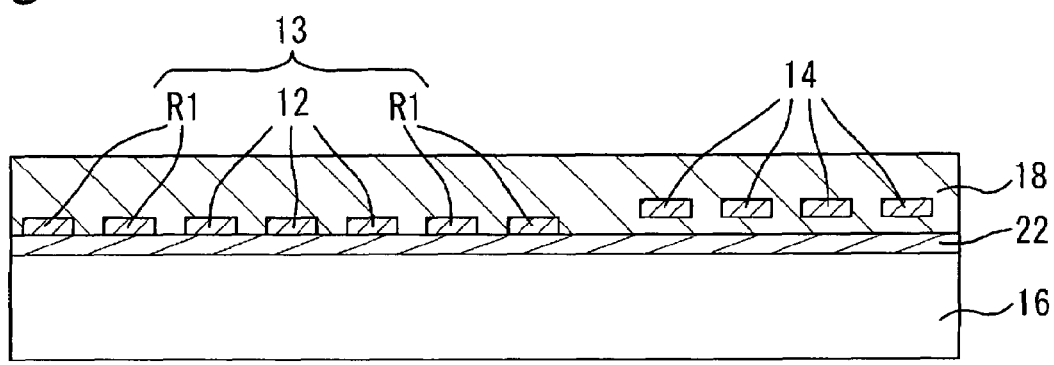
FIG. 10A is a cross-sectional view of an acoustic wave device in accordance with a fifth embodiment.
Figure 10B:
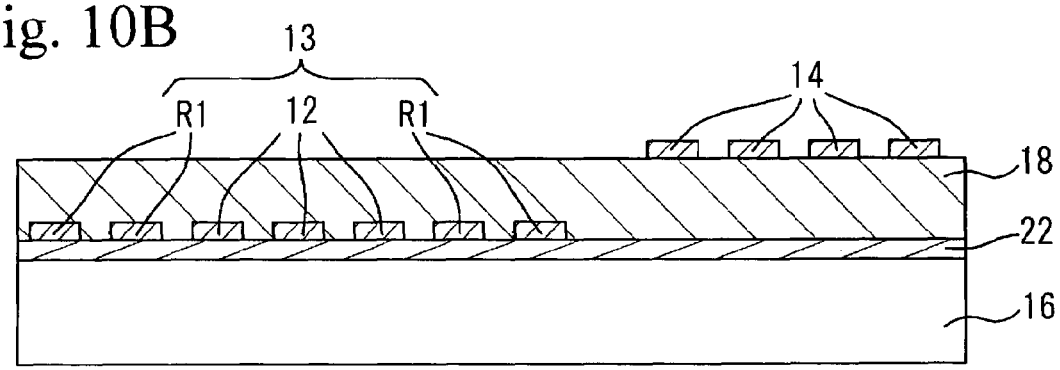
FIG. 10B is a cross-sectional view of an acoustic wave device in accordance with a first variation of the fifth embodiment.

FIG. 10A is a cross-sectional view of an acoustic wave device in accordance with a fifth embodiment, and FIG. 10B is a cross-sectional view of a first variation of the fifth embodiment. Referring to FIG. 10A, the third dielectric film 22 made of $Al_2O_3$ is provided on the piezoelectric substrate 16. The other structures of the fifth embodiment are the same as those of the fourth embodiment shown in FIG. 9A.

FIG. 10B shows an exemplary arrangement in which the capacitor 14 is provided on the first dielectric film 18. The other structures are the same as those of the fifth embodiment shown in FIG. 10A.

Sixth Embodiment

Figure 11A:
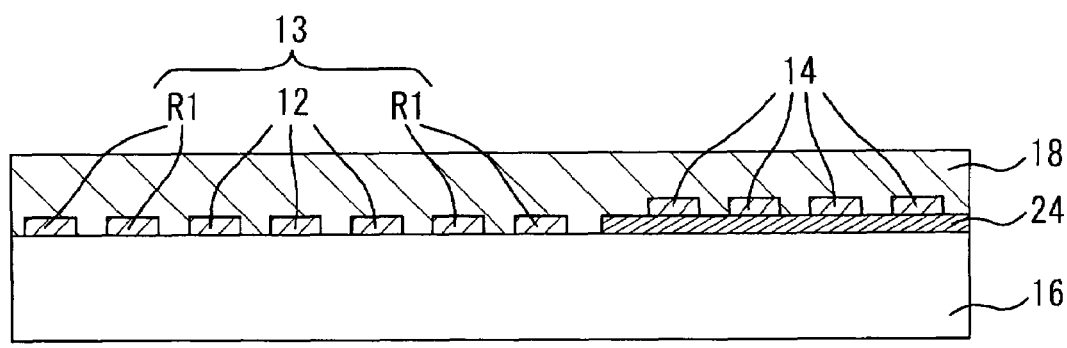
FIG. 11A is a cross-sectional view of an acoustic wave device in accordance with a sixth embodiment.
Figure 11B:
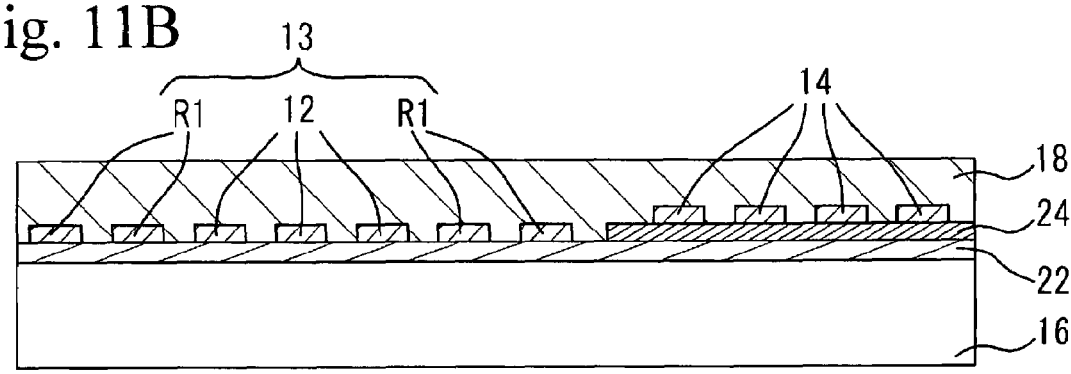
FIG. 11B is a cross-sectional view of an acoustic wave device in accordance with a first variation of the sixth embodiment.

FIG. 11A is a cross-sectional view of an acoustic wave device in accordance with a sixth embodiment, and FIG. 11B is a cross-sectional view of a first variation of the sixth embodiment. Referring to FIG. 11A, the fourth dielectric film 24 made of $Al_2O_3$ is provided between the capacitor 14 and the piezoelectric substrate 16. The other structures are the same as those of the fourth embodiment shown in FIG. 9A.

FIG. 11B shows that the third dielectric film 22 is provided on the piezoelectric substrate 16. The other structures are the same as those of the sixth embodiment shown in FIG. 11A.

Seventh Embodiment

Figure 12:
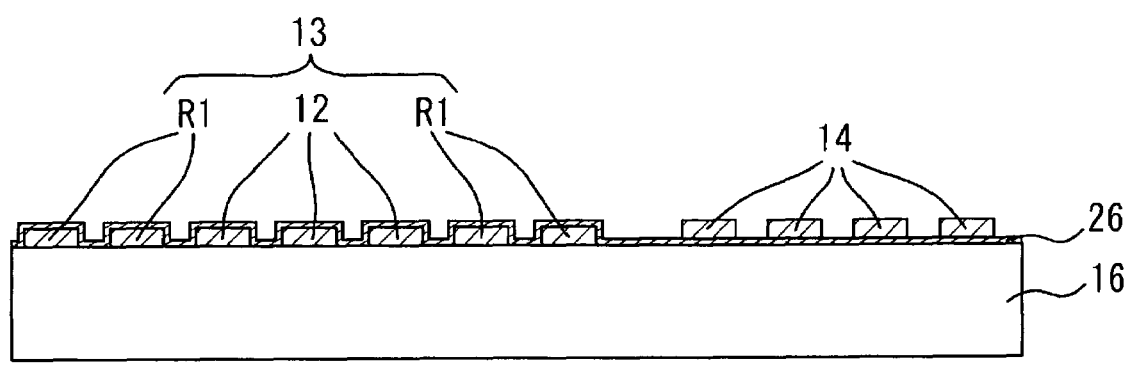
FIG. 12 is a cross-sectional view of an acoustic wave device in accordance with a seventh embodiment.

FIG. 12 is a cross-sectional view of an acoustic wave device in accordance with a seventh embodiment. Referring to FIG. 12, the resonators 13 composed of the comb electrodes 12 and the reflection electrodes R1 are formed on the piezoelectric substrate 16. A protection film 26 is provided so as to cover the comb electrodes 12 and the reflection electrodes R1. The capacitor 14 is connected in parallel with the resonator 13, and is provided on the protection film 26. The capacitor 14 is configured as the first comparative example. The protection film is thinner than the comb electrodes 12 of the resonator 13.

Eighth Embodiment

Figure 13A:
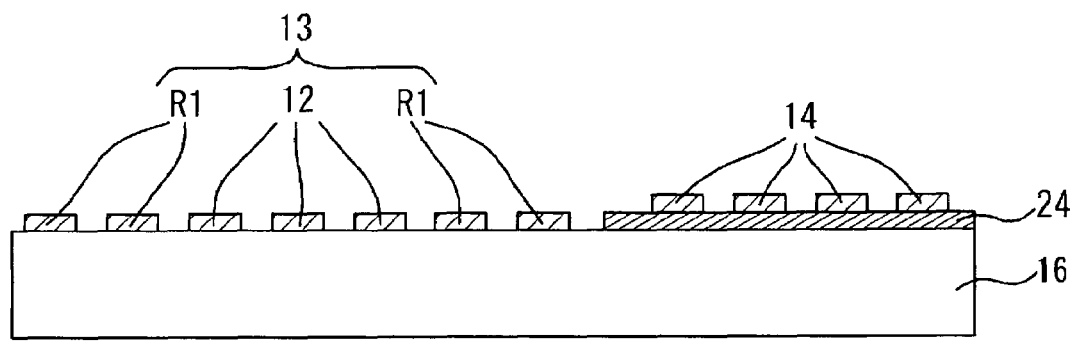
FIG. 13A is a cross-sectional view of an acoustic wave device in accordance with an eighth embodiment.
Figure 13B:
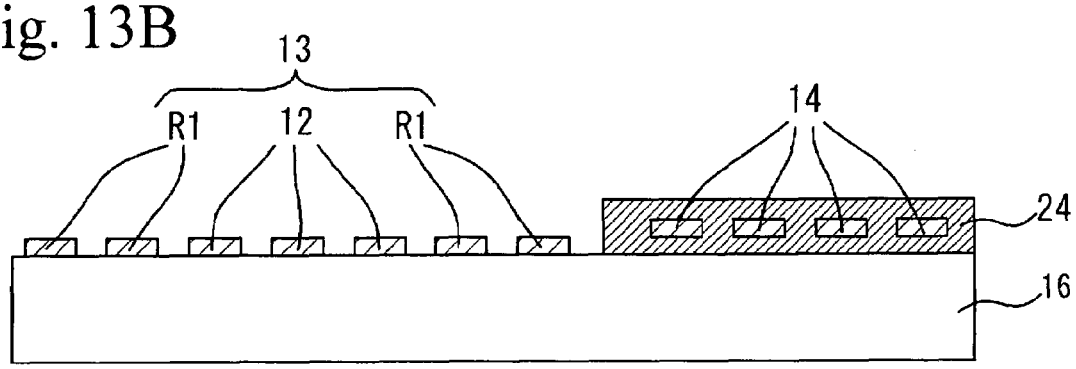
FIG. 13B is a cross-sectional view of an acoustic wave device in accordance with a first variation of the eighth embodiment.

FIG. 13A is a cross-sectional view of an acoustic wave device in accordance with an eighth embodiment, and FIG. 13B is a cross-sectional view of a first variation of the eighth embodiment. Referring to FIG. 13A, the comb electrodes 12 and the reflection electrodes R1 of the resonator 13 are formed on the piezoelectric substrate 16. The capacitor 14 is connected in parallel with the resonator 13, and is provided on the fourth dielectric film 24 formed on the piezoelectric substrate 16. The capacitor 14 is configured as the first comparative example.

FIG. 13B shows an exemplary arrangement in which the capacitor 14 is embedded in the fourth dielectric film 24. The other structures are the same as those of the eighth embodiment shown in FIG. 13A.

The acoustic wave devices of the seventh and eighth embodiments are SAW devices in which the acoustic wave is propagated along the surface of the piezoelectric substrate 16. The third dielectric film 22 may be provided between the piezoelectric substrate 16 and the comb electrodes 12 and the reflection electrodes R1 in the seventh and eighth embodiments.

In the first through eighth embodiments, the dielectric films between the capacitor 14 and the piezoelectric substrate 16 are the first dielectric film 18, the second dielectric film 20, the third dielectric film 22, the fourth dielectric film 24 or any combination thereof. However, the present invention is not limited to the above but may use another dielectric material and another combination as long as the capacitor 14 is further from the piezoelectric substrate 16 than the comb electrodes 12.

Ninth Embodiment

Figure 14:
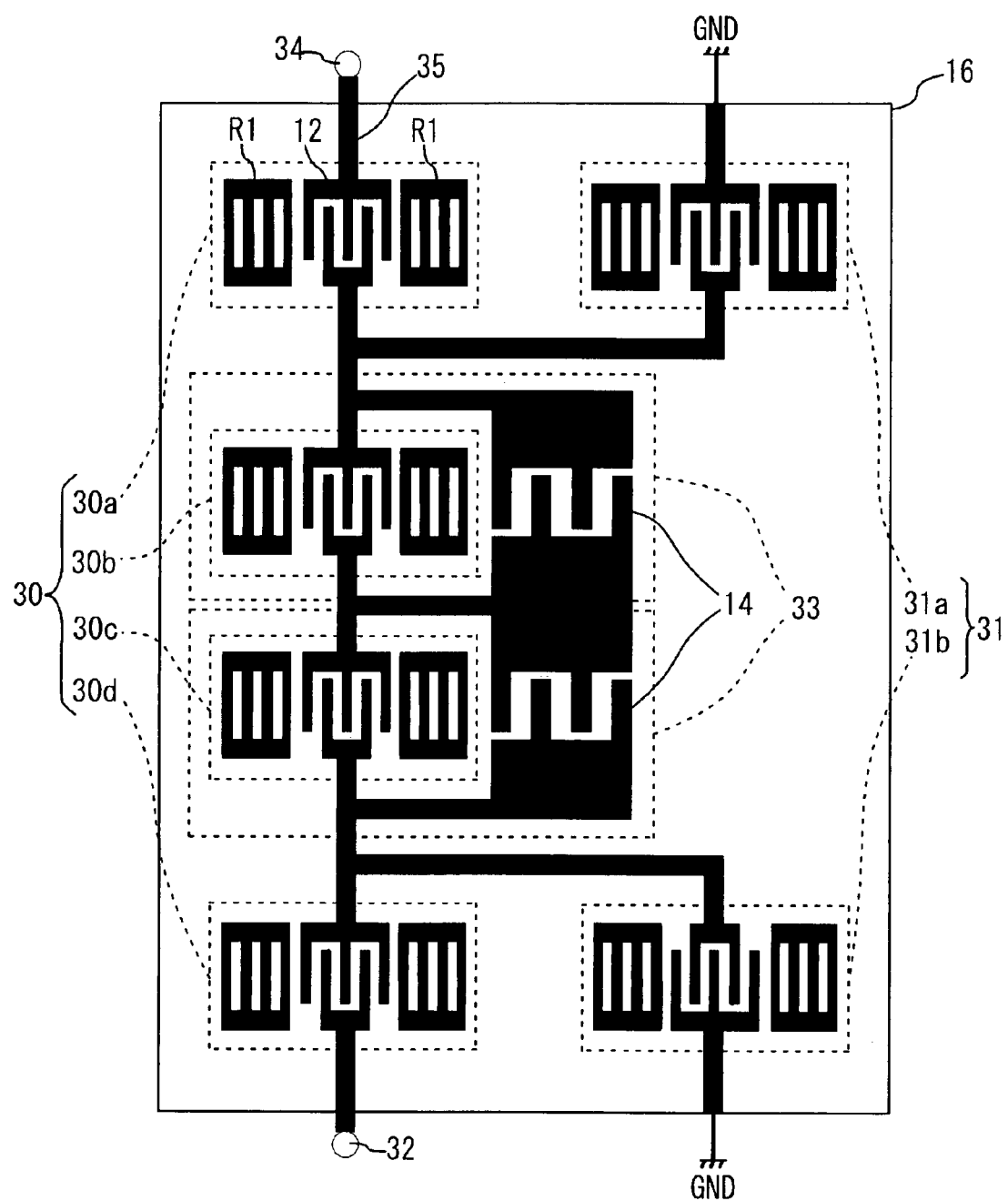
FIG. 14 schematically depicts a ladder filter in accordance with a ninth embodiment.

FIG. 14 schematically illustrates a ladder filter in accordance with a ninth embodiment. Referring to this figure, solid areas indicate the comb electrodes 12, the reflection electrodes R1, the comb-electrode type capacitor 14 and interconnection lines 35. Four one-port resonators 30a through 30d are connected in series between a first terminal 32 and a second terminal 34, so that a series-arm resonator is formed. A one-port parallel resonator 31a is connected between a node between the one-port resonators 30a and 30b and ground. A one-port parallel resonator 31b is connected between a node between the one-port resonators 30c and 30d and ground. The one-port parallel resonators 31a and 31b form a parallel-arm resonator 31 connected in parallel with the series-arm resonator 30. Each of the resonators 30a through 30d and 31a and 31b is composed of the two reflection electrodes R1 and the paired comb electrodes 12 interposed between the two reflection electrodes R1. One capacitor 14 is connected in parallel with the one-port series resonator 30b, so that a one-port resonator 33 can be formed. Similarly, another capacitor 14 is connected in parallel with the one-port series resonator 30c, so that another one-port resonator 33 can be formed. The one-port resonators 33 may be any of the first through eighth embodiments.

The ladder filter of the ninth embodiment is capable of effectively reducing the electromechanical coupling coefficient $k^2$, so that the rising ends of the pass band can be improved.

The present invention is not limited to the ladder filter of the ninth embodiment but may include another type of filter, such as a filter using a multimode filter and another filter composed of a one-port resonator and a multimode filter. Further, the present invention may include a duplexer using filters as described above.

The present invention is not limited to the specifically described embodiments and variations, but other embodiments and variations may be made without departing from the scope of the present invention.

The present application is based on Japanese Patent Application No. 2006-290494, the entire disclosure of which is hereby incorporated by reference.

What is claimed is:

1. An acoustic wave device comprising:
a piezoelectric substrate;
a resonator having comb electrodes that are provided above the piezoelectric substrate and excite an acoustic wave;
a capacitor that is provided above the piezoelectric substrate and is connected in series or parallel with the resonator, the capacitor including comb electrodes that horizontally face each other above the piezoelectric substrate; and
a first dielectric film between the comb electrodes of the capacitor and the piezoelectric substrate,
the first dielectric film having a thickness equal to that of the comb electrodes of the resonator,
wherein the comb electrodes of the capacitor have a period greater than that of the comb electrodes of the resonator.

2. The acoustic wave device as claimed in claim 1, wherein the resonator includes reflection electrodes.

3. The acoustic wave device as claimed in claim 2, further comprising a second dielectric film that covers the comb electrodes and the reflection electrodes of the resonator, wherein the second dielectric film has a thickness equal to or greater than that of the comb electrodes of the resonator.

4. The acoustic wave device as claimed in claim 3, wherein the second dielectric film comprises silicon oxide.

5. The acoustic wave device as claimed in claim 3, further comprising a third dielectric film provided on the first dielectric film, wherein the third dielectric film has an acoustic velocity greater than that of the first dielectric film.

6. The acoustic wave device as claimed in claim 3, further comprising a fourth dielectric film provided between the comb electrodes and reflection electrodes of the resonator and the piezoelectric substrate.

7. The acoustic wave device as claimed in claim 1, wherein the comb electrodes of the capacitor have a width of electrode fingers greater than that of the comb electrodes of the resonator.

8. The acoustic wave device as claimed in claim 1, wherein the piezoelectric substrate comprises one of lithium niobate and lithium tantalate.

9. A filter comprising resonators connected, the resonators including an acoustic wave device comprising:
a piezoelectric substrate;
a resonator having comb electrodes that are provided above the piezoelectric substrate and excite an acoustic wave;
a capacitor that is provided above the piezoelectric substrate and is connected in series or parallel with the resonator, the capacitor including comb electrodes that horizontally face each other above the piezoelectric substrate; and
a dielectric film between the comb electrodes of the capacitor and the piezoelectric substrate,
the dielectric film having a thickness equal to that of the comb electrodes of the resonator, wherein the comb electrodes of the capacitor have a period greater than that of the comb electrodes of the resonator.

10. An acoustic wave device comprising:
a piezoelectric substrate;
a resonator having comb electrodes and reflection electrodes that are provided above the piezoelectric substrate and excite an acoustic wave;
a capacitor that is provided above the piezoelectric substrate and is connected in series or parallel with the resonator, the capacitor including comb electrodes that horizontally face each other above the piezoelectric substrate; and
a dielectric film between the comb electrodes of the capacitor and the piezoelectric substrate,
the dielectric film also covering the comb electrodes of the resonator and the reflection electrodes of the resonator, and comb electrodes of the capacitor, an having a thickness equal to or greater than that of the comb electrodes of the resonator,
wherein the comb electrodes of the capacitor have a period greater than that of the comb electrodes of the resonator.

11. An acoustic wave device comprising:
a piezoelectric substrate;
a resonator having comb electrodes and reflection electrodes that are provided above the piezoelectric substrate and excite an acoustic wave;
a capacitor that is provided above the piezoelectric substrate and is connected in series or parallel with the resonator, the capacitor including comb electrodes that horizontally face each other above the piezoelectric substrate; and
a first dielectric film between the comb electrodes of the capacitor and the piezoelectric substrate,
a second dielectric film that covers the comb electrodes and the reflection electrodes of the resonator and comb electrodes of the capacitor, the second dielectric film having a thickness equal to or greater than that of the comb electrodes of the resonator,
wherein the comb electrodes of the capacitor have a period greater than that of the comb electrodes of the resonator.

* * * * *